US007651930B2

(12) United States Patent
Suzuki et al.

(10) Patent No.: US 7,651,930 B2
(45) Date of Patent: Jan. 26, 2010

(54) METHOD OF MANUFACTURING SEMICONDUCTOR STORAGE DEVICE

(75) Inventors: Takashi Suzuki, Yokohama (JP); Hirokazu Ishida, Yokohama (JP); Ichiro Mizushima, Yokohama (JP); Yoshio Ozawa, Yokohama (JP); Fumiki Aiso, Yokohama (JP); Katsuyuki Sekine, Yokohama (JP); Takashi Nakao, Yokohama (JP); Yoshihiko Saito, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 12/146,802

(22) Filed: Jun. 26, 2008

(65) Prior Publication Data

US 2009/0004833 A1 Jan. 1, 2009

(30) Foreign Application Priority Data

Jun. 26, 2007 (JP) ............................. 2007-167999

(51) Int. Cl.
*H01L 21/20* (2006.01)
(52) U.S. Cl. ...................................... 438/486; 438/524
(58) Field of Classification Search ................. 438/478, 438/479, 482, 486, 502, 509, 514, 517, 524, 438/530, 778, 795
See application file for complete search history.

(56) References Cited

U.S. PATENT DOCUMENTS

| 5,373,803 | A | * | 12/1994 | Noguchi et al. ............... 117/8 |
| 5,448,107 | A | * | 9/1995 | Osada et al. ............... 257/706 |
| 5,858,820 | A | * | 1/1999 | Jung et al. ................. 438/150 |
| 6,013,544 | A | * | 1/2000 | Makita et al. ............... 438/166 |
| 6,168,659 | B1 | * | 1/2001 | Yuri et al. ..................... 117/89 |
| 6,174,754 | B1 | * | 1/2001 | Lee et al. ..................... 438/142 |
| 2002/0144643 | A1 | * | 10/2002 | Nishinaga .................... 117/84 |
| 2005/0019994 | A1 | * | 1/2005 | Chang ......................... 438/166 |
| 2007/0163489 | A1 | * | 7/2007 | Son et al. ...................... 117/92 |
| 2007/0224789 | A1 | * | 9/2007 | Kang et al. ................. 438/487 |
| 2007/0298594 | A1 | * | 12/2007 | Mizushima et al. ......... 438/479 |
| 2008/0283839 | A1 | * | 11/2008 | Watanabe et al. ............ 257/66 |

FOREIGN PATENT DOCUMENTS

| JP | 5-335234 | 12/1993 |
| JP | 6-333822 | 12/1994 |
| JP | 9-36042 | 2/1997 |

OTHER PUBLICATIONS

U.S. Appl. No. 12/167,695, filed Jul. 3, 2008, Mizushima, et al.

* cited by examiner

*Primary Examiner*—Savitri Mulpuri
(74) *Attorney, Agent, or Firm*—Oblon, Spivak, McClelland, Maier & Neustadt, L.L.P.

(57) ABSTRACT

A method of manufacturing a semiconductor storage device includes providing an opening portion in a plurality of positions in an insulating film formed on a silicon substrate, and thereafter forming an amorphous silicon film on the insulating film, in which the opening portions are formed, and in the opening portions. Then, trenches are formed to divide the amorphous silicon film, in the vicinity of a midpoint between adjacent opening portions, into a portion on one opening portion side and a portion on the other opening portion side. Next, the amorphous silicon film, in which the trenches are formed, is annealed and subjected to solid-phase crystallization to form a single crystal with the opening portions used as seeds, and thereby a silicon single-crystal layer is formed. Then, a memory cell array is formed on the silicon single-crystal layer.

7 Claims, 14 Drawing Sheets

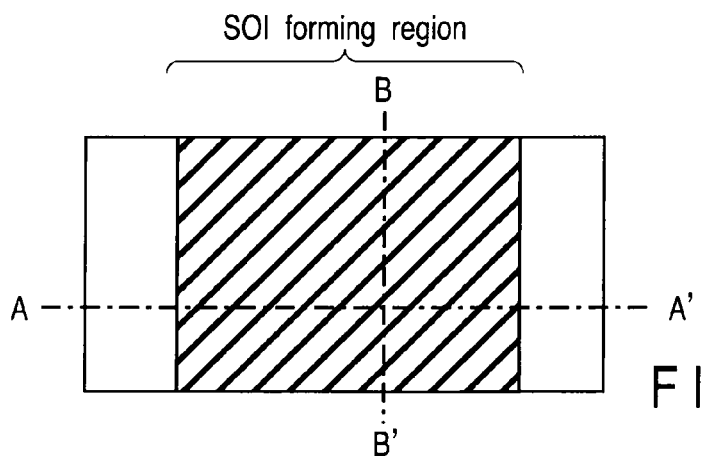
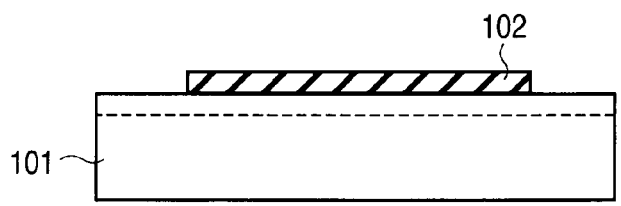 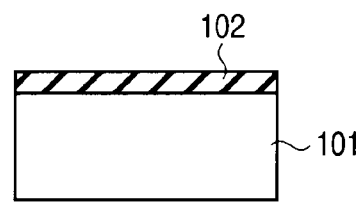
FIG. 1A    FIG. 1B
FIG. 1C
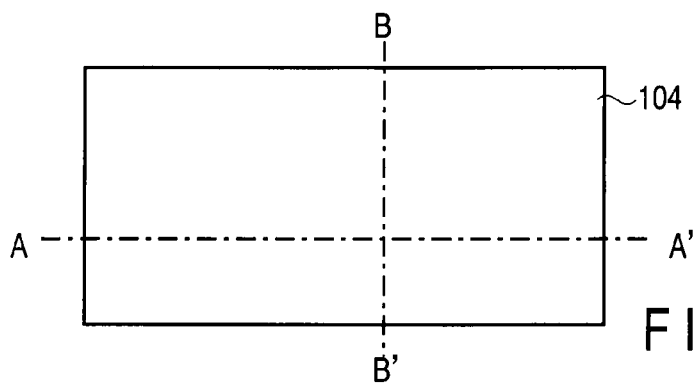
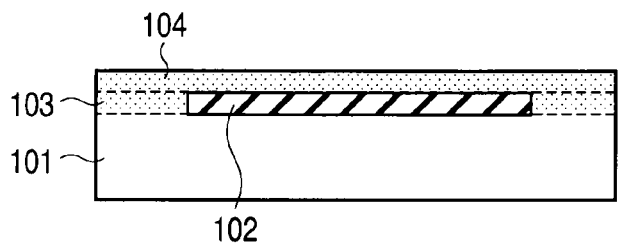 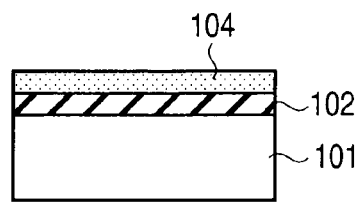
FIG. 2A    FIG. 2B
FIG. 2C

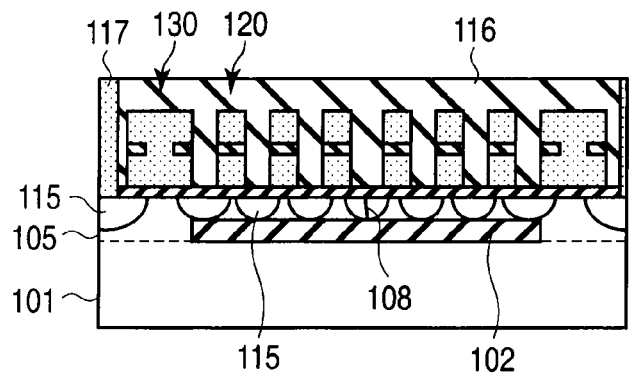 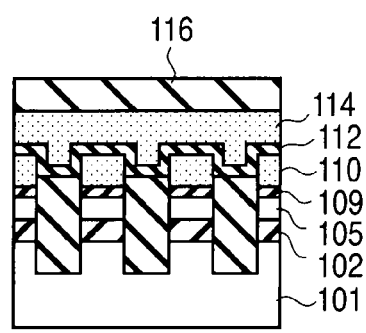
F I G. 9A  F I G. 9B
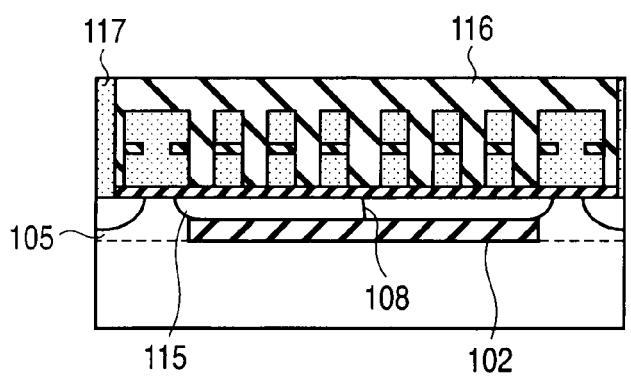 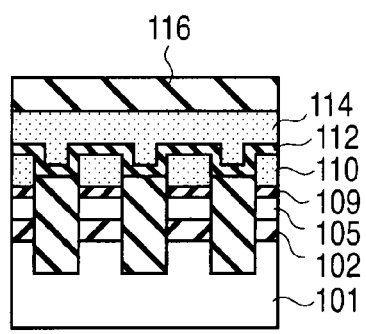
F I G. 10A  F I G. 10B
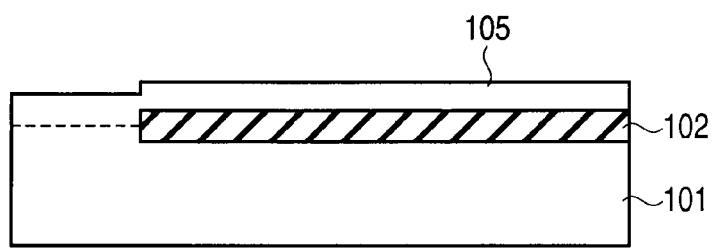
F I G. 11

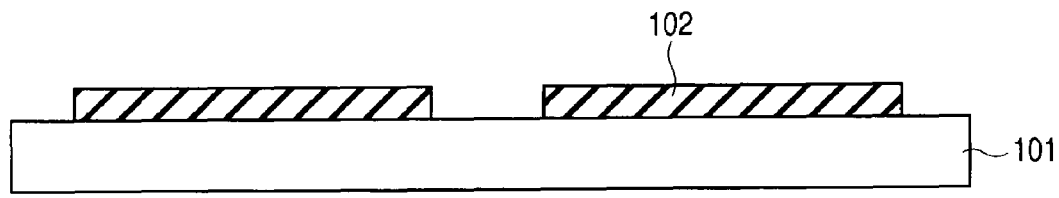
F I G. 24A
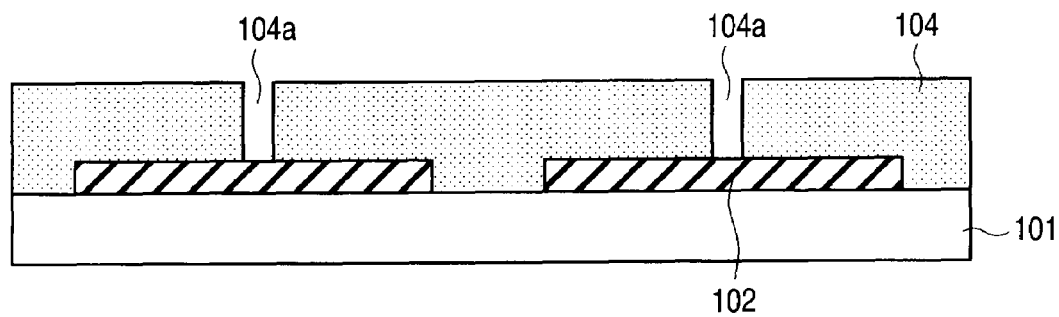
F I G. 24B
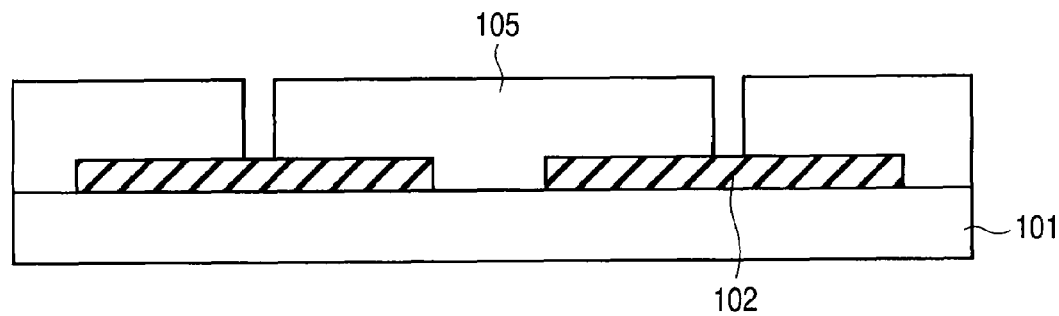
F I G. 24C
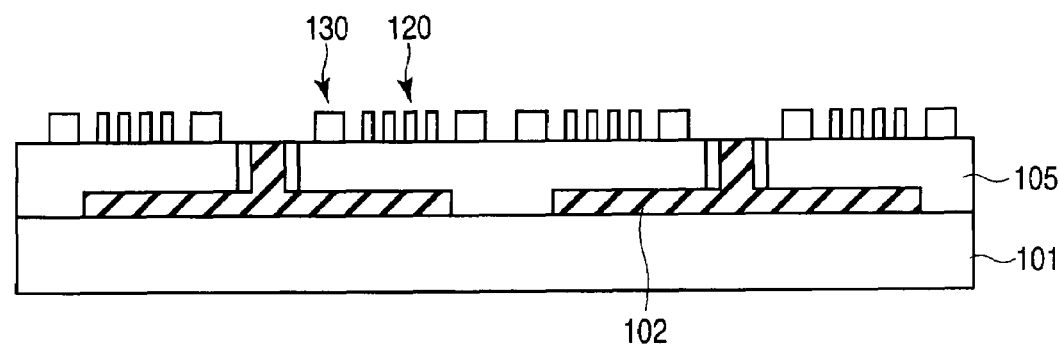
F I G. 24D

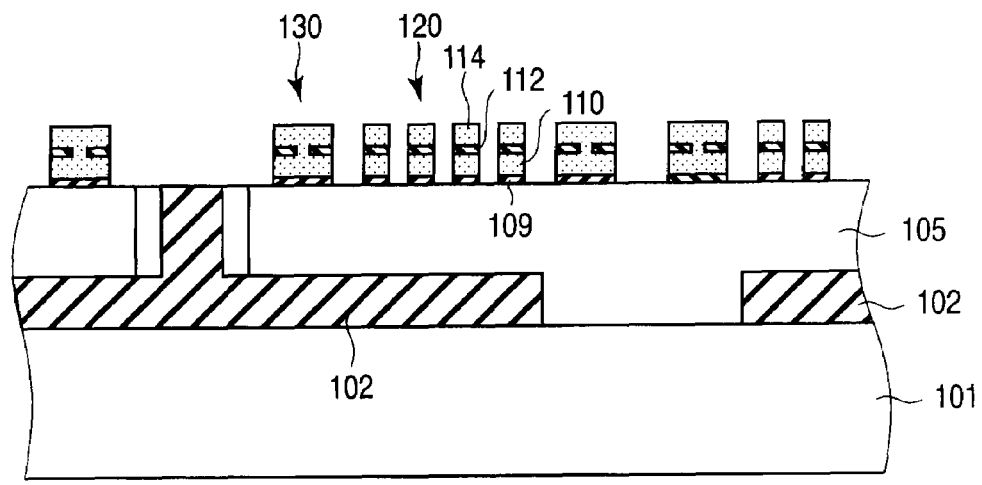
F I G. 25
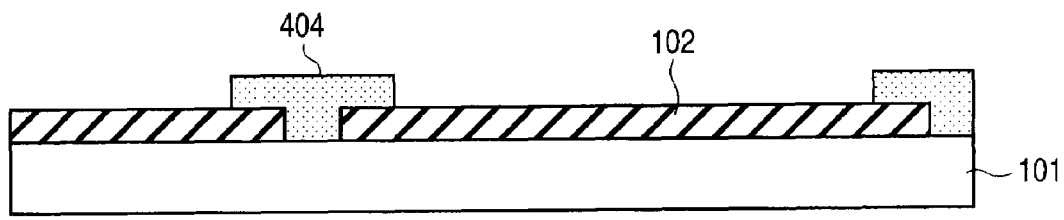
F I G. 26A
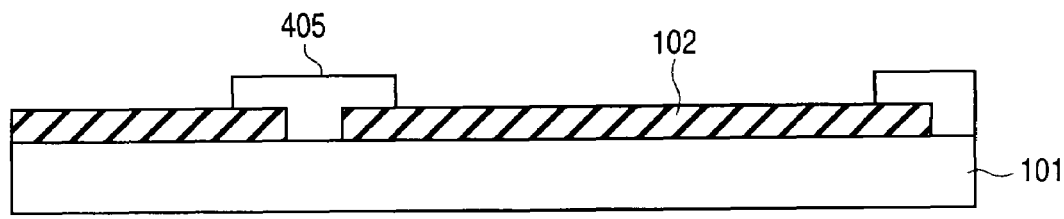
F I G. 26B
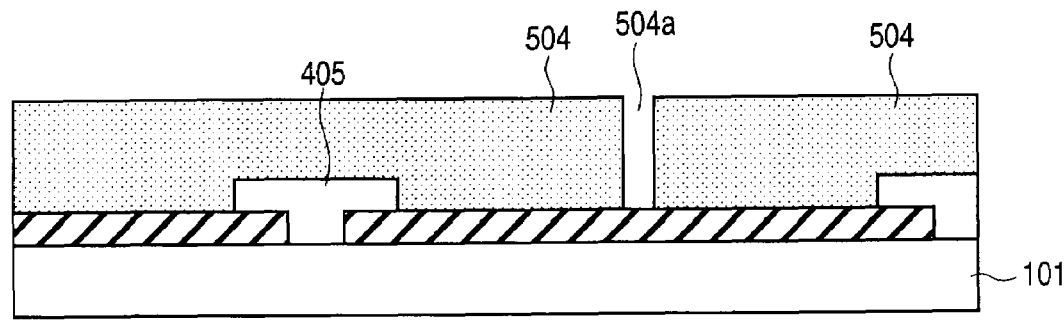
F I G. 26C

METHOD OF MANUFACTURING SEMICONDUCTOR STORAGE DEVICE

CROSS-REFERENCE TO RELATED APPLICATIONS

This application is based upon and claims the benefit of priority from prior Japanese Patent Application No. 2007-167999, filed Jun. 26, 2007, the entire contents of which are incorporated herein by reference.

BACKGROUND OF THE INVENTION

1. Field of the Invention

The present invention relates to a method of manufacturing a semiconductor storage device in which memory cells are formed on a silicon-on-insulator (SOI) structure.

2. Description of the Related Art

In structures of memory cell portions of conventional nonvolatile semiconductor storage devices, making finer memory cells has limitations for the following reason. Specifically, when the channel length of memory cells is set to 50 nm or less, the on/off ratio of the channel current decreases due to the short channel effect. Decrease in the on/off ratio of the channel current causes transistors of memory cells to malfunction.

Therefore, recently, methods of forming memory cells on an SOI crystal have been proposed (Jpn. Pat. Appln. KOKAI Pub. No. 5-335234, Jpn. Pat. Appln. KOKAI Pub. No. 6-333822, Jpn. Pat. Appln. KOKAI Pub. No. 9-36024). However, it is difficult to form a silicon layer having a large area and good crystal properties on an insulating film, and there is the problem that variations occur between cells. In particular, in devices on an SOI structure using solid-phase crystallization, a mismatch surface having an uncertain position is generated on an embedded insulating film. Therefore, there is the problem that cell transistors are formed on the mismatch surface, and operation thereof become unstable.

When a single-crystal layer is formed on an SOI region by solid-phase crystallization, monocrystallization is performed from opening portions (seed regions) provided in an embedded insulating film toward the SOI region. The growth surface of solid-phase crystallization in this case varies from position to position as the distance from the seed region becomes longer. Therefore, the position of the crystal grain boundary (crystal mismatch surface) determined by the solid-phase crystallization distance from adjacent opening portions differs according to the position.

As a result, for example, the crystal mismatch surface may be formed in just the intermediate position of the seed regions, or may be formed in a position shifted from the intermediate position of the seed regions. Since a plurality of seed portions, that is, opening portions of the insulating film, are provided in the silicon substrate, occurrence of the crystal mismatch surface is inevitable.

Since the crystal properties deteriorate in crystal mismatch surfaces, it is not preferable to provide LSI circuits directly on crystal mismatch surfaces, in terms of reliability of the thermal oxide film of LSI circuits and control of pn junction by a dopant diffusion layer. Therefore, it is necessary to design LSI circuits to avoid a portion of the crystal mismatch surface. The defective region caused by a crystal mismatch surface is not always positioned in the midpoint between opening portions of the SOI region, but may be shifted from the midpoint by about below 1 µm, due to variations of the solid-phase crystallization speed. Supposing that the length of SOI on which solid-phase crystallization can be performed is about 3 µm from opening portions, intervals between opening portions have to be set to about 5 µm. To make room for a defective region, which may occupy 1 µm, around the center of the area of 5 µm without providing any circuit further reduces the occupying proportion of circuits, and increases the chip manufacturing cost.

BRIEF SUMMARY OF THE INVENTION

According to one aspect of the present invention, there is provided a method of manufacturing a semiconductor storage device, comprising: providing an opening portion in a plurality of positions in an insulating film formed on a silicon substrate; forming an amorphous silicon film on the insulating film, in which the opening portions are formed, and in the opening portions; annealing and subjecting the amorphous silicon film to solid-phase crystallization with the opening portions used as seeds, and thereby monocrystallizing the amorphous silicon film; performing ion implantation into a region including a seam portion generated by contact of growing ends from adjacent opening portions with the solid-phase crystallization, and amorphizing the region; annealing again and subjecting the amorphized region to solid-phase crystallization, and thereby monocrystallizing the amorphized region; and forming a memory cell array on a silicon single-crystal layer formed by the solid-phase crystallization and the second solid-phase crystallization.

Further, according to another aspect of the present invention, there is provided a method of manufacturing a semiconductor storage device, comprising: providing an opening portion in a plurality of positions in an insulating film formed on a silicon substrate; forming an amorphous silicon film on the insulating film, in which the opening portions are formed, and in the opening portions, performing ion implantation into a region, which is a part of the amorphous silicon film and in which growing ends of solid-phase crystallizations from adjacent opening portions are expected to contact; annealing the amorphous silicon film having the region in which the ion implantation is performed, subjecting the amorphous silicon film to solid-phase crystallization with the opening portions used as seeds, and thereby forming a silicon singe-crystal layer; and forming a memory cell array on the silicon single-crystal layer.

According to another aspect of the present invention, there is provided a method of manufacturing a semiconductor storage device, comprising: providing an opening portion in a plurality of positions in an insulating film formed on a silicon substrate; forming an amorphous silicon film on the insulating film, in which the opening portions are formed, and in the opening portions; forming trenches to divide the amorphous silicon film, in the vicinity of a midpoint between adjacent opening portions, into a portion on one opening portion side and a portion on the other opening portion side; annealing and subjecting the amorphous silicon film, in which the trenches are formed, to solid-phase crystallization to form a single crystal with the opening portions used as seeds, and thereby forming a silicon single-crystal layer; and forming a memory cell array on the silicon single-crystal layer.

BRIEF DESCRIPTION OF THE SEVERAL VIEWS OF THE DRAWING

FIGS. 1A to 1C are a plan view and cross-sectional views illustrating a manufacturing step of a nonvolatile semiconductor storage device according to a first embodiment.

FIGS. 2A to 2C are a plan view and cross-sectional views illustrating a manufacturing step of the nonvolatile semiconductor storage device according to the first embodiment.

FIGS. 9A and 9B are cross-sectional views illustrating a manufacturing step of the nonvolatile semiconductor storage device according to the first embodiment.

FIGS. 10A and 10B are cross-sectional views illustrating a manufacturing step of the nonvolatile semiconductor storage device according to the first embodiment.

FIG. 11 is a cross-sectional view illustrating a manufacturing step of the nonvolatile semiconductor storage device according to the first embodiment.

FIGS. 24A to 24D are cross-sectional views illustrating manufacturing steps of a nonvolatile semiconductor storage device according to a fourth embodiment.

FIG. 25 is an enlarged cross-sectional view illustrating a part of the structure illustrated in FIG. 24D.

FIGS. 26A to 26C are a plan view and cross-sectional views illustrating a manufacturing step of a nonvolatile semiconductor storage device according to a fifth embodiment.

DETAILED DESCRIPTION OF THE INVENTION

Details of the present invention will be explained below with reference to embodiments illustrated in drawings.

First Embodiment

The first embodiment proposes a method of reducing defects of memory cells, by achieving position control of crystal mismatch surfaces of an SOI crystal layer, which causes problems in manufacturing an SOI structure by solid-phase crystallization.

A method of manufacturing memory cell portions according to the first embodiment is explained below with reference to FIGS. 1A to 1C to FIGS. 10A and 10B. In FIGS. 1A to 1C to 10A and 10B, A is a cross-sectional view taken in a channel length direction (bit line direction), B is a cross-sectional view taken in a channel width direction (word line direction), and C is a plan view. A illustrates a cross section taken along line A-A' of plan view C, and B illustrates a cross section taken along line B-B' of plan view C.

First, as illustrated in FIGS. 1A to 1C, a silicon oxide film (embedded insulating film) 102 having a thickness of 50 nm is formed on a surface of a p-type single-crystal silicon substrate 101. Then, a part of the region of the silicon oxide film 102 is removed with a patterned resist (not shown) used as a mask, and a part of the silicon substrate 101 is exposed. Specifically, stripe opening portions are provided, which serve as seeds of solid-phase crystallization described below.

Next, as illustrated in FIGS. 2A to 2C, an amorphous silicon film 103 having a larger thickness than the silicon oxide film 102 is formed on the silicon substrate 101 and the silicon oxide film 102 by chemical vapor deposition (CVD) or the like. Then, chemical and mechanical polishing (CMP) is performed with the silicon oxide film 102 used as a stopper, such that the upper surfaces of the amorphous silicon film 103 and the silicon oxide film 102 connected flat. Thereafter, an amorphous silicon film 104 having a thickness of about 50 nm is formed on the silicon substrate 101 and the amorphous silicon film 103 by CVD or the like.

Figure 3C:
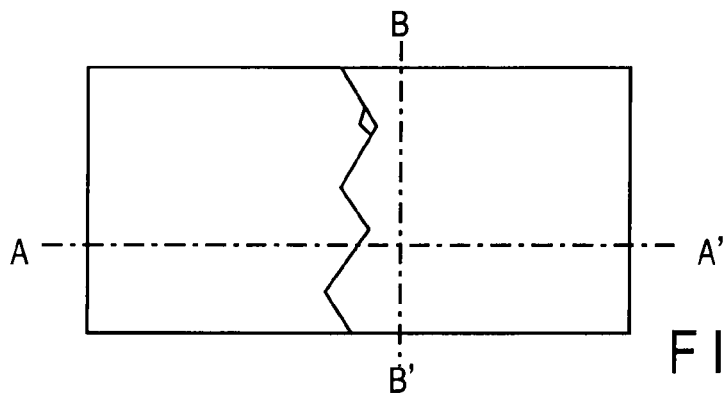
FIGS. 3A to 3C are a plan view and cross-sectional views illustrating a manufacturing step of the nonvolatile semiconductor storage device according to the first embodiment.
Figure 3A:
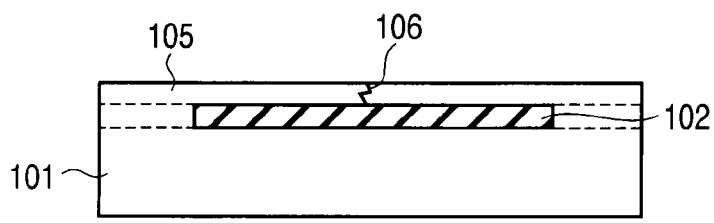
Figure 3B:
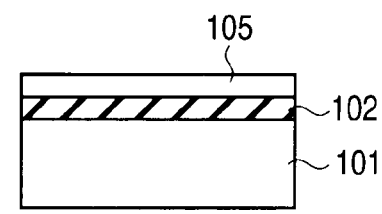

Next, as illustrated in FIGS. 3A to 3C, annealing is performed at 600° C. for about 2 hours, and thereby the amorphous silicon films 103 and 104 are subjected to solid-phase crystallization, with their contact portions with the silicon substrate 101 used as seeds. Thereby, a single-crystal silicon layer (SOI crystal layer) 105 is formed. In this case, a crystal mismatch surface 106, which is caused by encounter of progressing solid-phase crystallizations from the right and the left, is generated in the vicinity of the center of the single-crystal silicon layer 105 on the silicon oxide film 102.

Figure 4C:
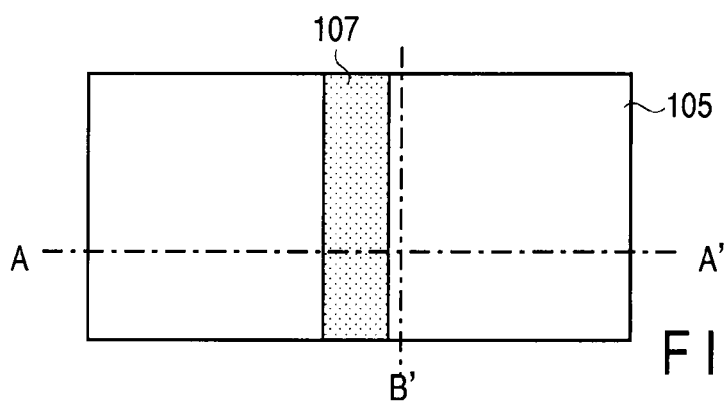
FIGS. 4A to 4C are a plan view and cross-sectional views illustrating a manufacturing step of the nonvolatile semiconductor storage device according to the first embodiment.
Figure 4A:
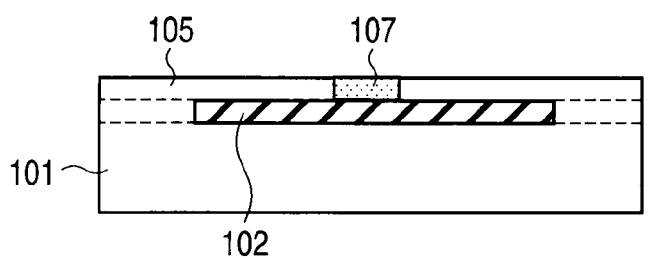
Figure 4B:
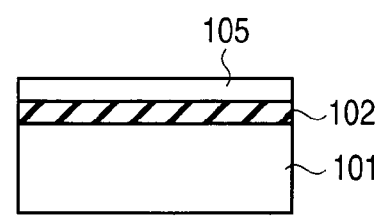

Next, as illustrated in FIGS. 4A to 4C, silicon ions are implanted into a region including the crystal mismatch surface 106 with implantation energy of 50 eV and a dose amount of about $50 \times 10^{15}/cm^{-2}$, with a patterned resist (not shown) used as a mask. Thereby, the crystal portion including the crystal mismatch surface 106 is amorphized into amorphous silicon 107.

Figure 5C:
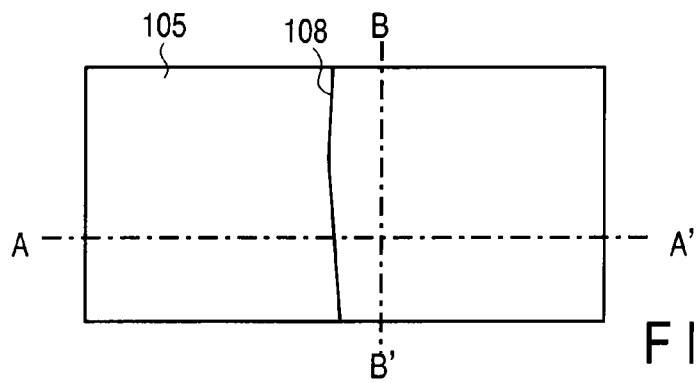
FIGS. 5A to 5C are a plan view and cross-sectional views illustrating a manufacturing step of the nonvolatile semiconductor storage device according to the first embodiment.
Figure 5A:
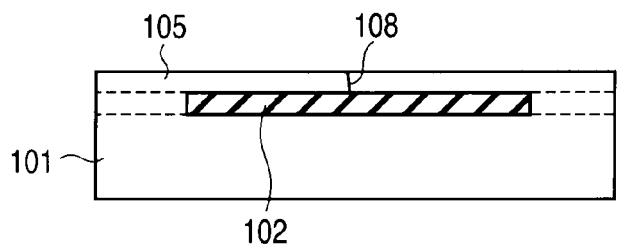
Figure 5B:
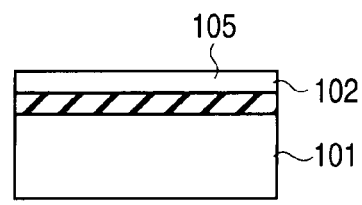

Next, as illustrated in FIGS. 5A to 5C, annealing is performed again at 600° C. and for about 2 hours, the amorphous silicon 107 is subjected to solid-phase crystallization, and thereby a single-crystal silicon layer 105 is formed. In this step, a new crystal mismatch surface 108 is generated in the vicinity of the center of the region which was the amorphous silicon 107.

Although the first embodiment shows the case where silicon ions are implanted, any ions which can amorphize single-crystal silicon can be implanted. For example, it is possible to use germanium, phosphorus, arsenic, antimony, and argon. These ions also can change the crystal portion including a crystal mismatch surface into amorphous silicon.

The position of the crystal mismatch surface 106 generated by the first solid-phase crystallization widely varies as the solid-phase crystallization distance becomes longer, since the solid-phase crystallization speed differs from position to position. As a result, the crystal mismatch surface 106 has a width of about 1 to 10 μm. The crystal growth distance can be shortened by changing the crystal portion including the crystal mismatch surface 106 into the amorphous silicon 107, and performing solid-phase crystallization again with a limited area (with a short solid-phase crystallization distance). Therefore, as illustrated in FIGS. 5A to 5C, variations in position of the crystal mismatch surface 108 can be reduced.

When cells are formed on an SOI crystal layer, a crystal mismatch surface causes a leak current, and causes variations in threshold value. Therefore, the position of the crystal mismatch surface is controlled, and thereby it is possible to easily form a structure in which no cells are formed on the crystal mismatch surface. Further, since an area reserved as a non-cell-forming region not to form cells on a crystal mismatch surface can be reduced, cells can be formed with good area efficiency.

Although a step of performing ion implantation for amorphization and annealing for solid-phase crystallization is performed only once in the first embodiment, the step can be performed a plurality of times, while the opening width of the resist mask gradually reduced. By performing the step a plurality of times, it is possible to control the position and the width of the crystal mismatch surface with higher accuracy.

Figure 6C:
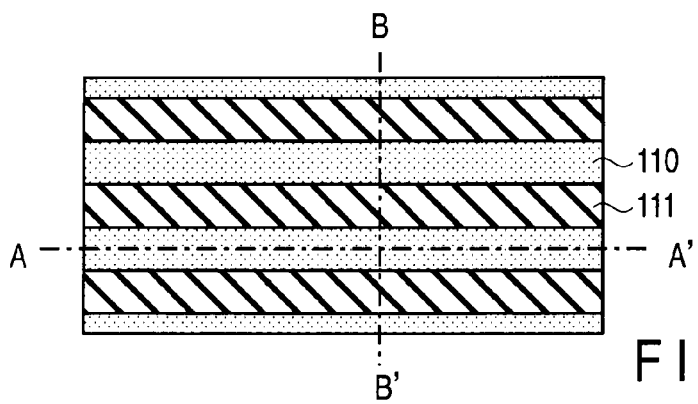
FIGS. 6A to 6C are a plan view and cross-sectional views illustrating a manufacturing step of the nonvolatile semiconductor storage device according to the first embodiment.
Figure 6A:
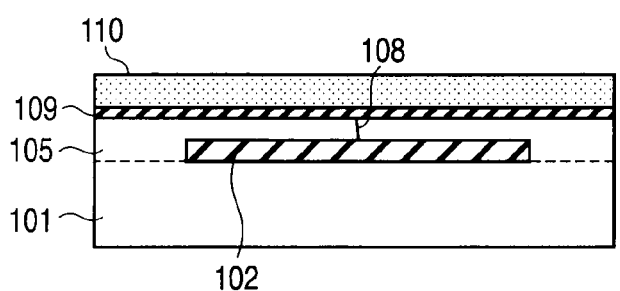
Figure 6B:
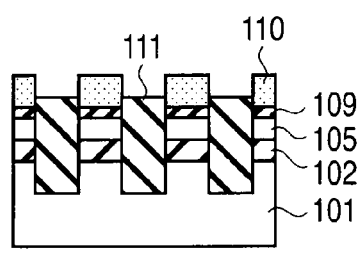

Next, as illustrated in FIGS. 6A to 6C, a gate insulating film (tunnel insulating film) 109 having a thickness of about 7 nm is formed on the whole surface by thermal oxidation or the like, and a phosphorus-doped polycrystalline silicon layer 110 serving as a floating gate electrode and having a thickness of about 50 nm is deposited thereon by CVD or the like. Next, parts of the polycrystalline silicon layer 110, the gate insulating film 109, the single-crystal silicon layer 105, the silicon oxide film 102, and the silicon substrate 101 are removed by RIE or the like with a striped resist (not shown) used as a mask, and thereby device isolation trenches are formed. In this step, a pattern which prevents cell portions from being positioned on the crystal mismatch surface 108 in the SOI crystal layer 105 is used for the resist mask.

Next, an embedded insulating film 111 is embedded into the device isolation trench regions by application or the like. In formation of the embedded insulating film 111, formation of imperfect embedded regions which are called voids can be avoided, by applying an application insulating film such as polysilazane. The dielectric constant of the embedded insulating film 111 is preferably low, to improve the dielectric strength voltage between adjacent memory cells. Therefore, it is desirable that vapor oxidation is performed after applying the application insulating film, to desorb impurities such as nitrogen, carbon and hydrogen in the film and convert the film into the silicon oxide film. Further, thermal oxidation or radical oxidation may be performed before or after the application insulating film 11 is embedded, to repair crystal defects which are generated in trench surface portions when the device isolation trenches are formed. Further, a composite film of a CVD insulating film and an application insulating film may be embedded, to improve the insulating property of the embedded insulating film 111.

Figure 7C:
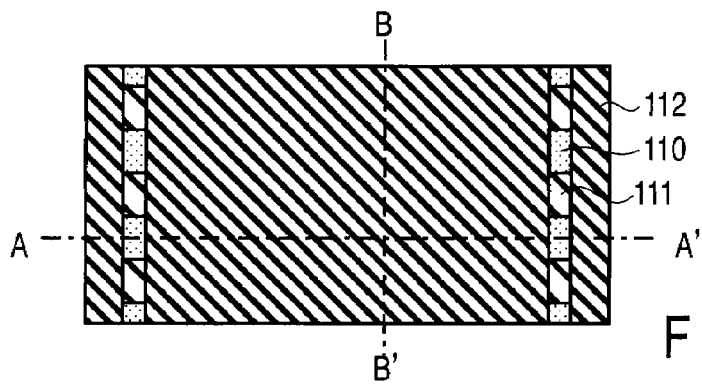
FIGS. 7A to 7C are a plan view and cross-sectional views illustrating a manufacturing step of the nonvolatile semiconductor storage device according to the first embodiment.
Figure 7A:
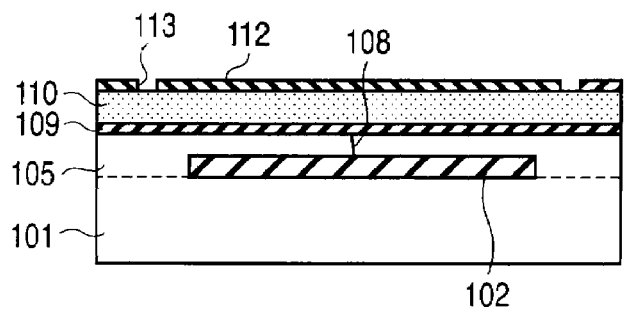
Figure 7B:
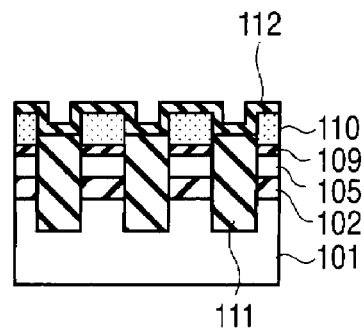

Next, as illustrated in FIGS. 7A to 7C, an ONO film 12 serving as an interelectrode insulating film and having a thickness of about 15 nm is formed on the whole surface by CVD or atomic layer deposition (ALD), etc. Then, the ONO film 112 is subjected to selective etching by RIE or the like, with a patterned resist (not shown) used as a mask. Specifically, slit portions 113 having a width of about 50 nm are formed in regions in which selective gate transistors are to be formed, and thereby parts of the polycrystalline silicon layer 110 are exposed.

Figure 8C:
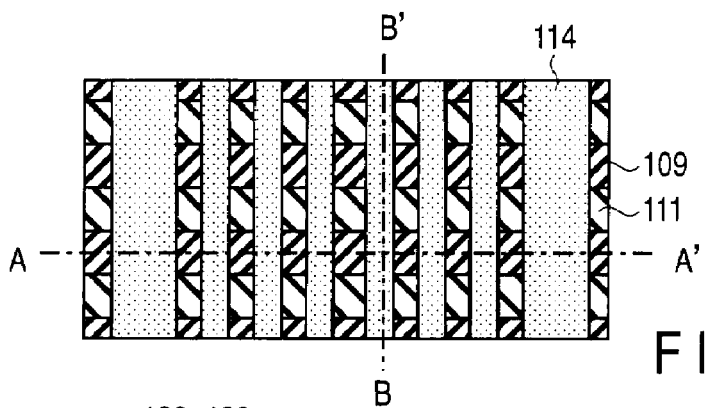
FIGS. 8A to 8C are a plan view and cross-sectional views illustrating a manufacturing step of the nonvolatile semiconductor storage device according to the first embodiment.
Figure 8A:
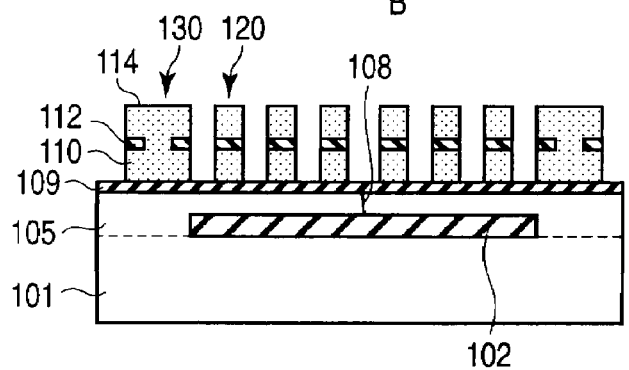
Figure 8B:
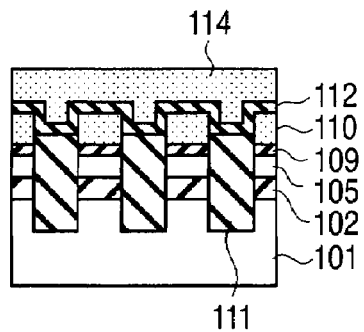

Next, as illustrated in FIGS. 8A to 8C, a tungsten silicide layer 114 serving as a control gate electrode is formed on the whole surface by spattering or the like. In this step, the polycrystalline silicon layer 110 is electrically connected to the tungsten silicide layer 114 in the slit portions 113. Then, parts of the tungsten silicide layer 114, the ONO film 112, and the polycrystalline silicon layer 110 are selectively etched by RIE or the like, with a striped resist (not shown) used as a mask. Thereby, two-layer gate structures 120 of memory cells and stacked gate electrode structures 130 of selective gate transistors 130 are formed.

In this state, the boundary between the SOI region and the non SOI region is located under an area between one of the two-layer gate structures 120 closest to the stacked gate electrode structure 130 and the stacked gate electrode structure 130, or under the stacked gate electrode structure 130.

Next, as illustrated in FIGS. 9A and 9B, n-type impurity diffusion layers 115 having a desired impurity concentration distribution are formed by a combination of ion implantation and thermal diffusion. Then, an interlayer insulating film 116 is formed by CVD or the like, to cover the two-layer gate structures 120 of memory cells and the stacked gate electrode structures 130 of selective gate transistors. In addition, openings are formed in the interlayer insulating film 116 on the impurity diffusion layer of the selective gate transistors by a known method. Thereafter, bit line contacts 117 (and source line contacts) are formed by embedding a conductor such as tungsten into the openings. Then, a nonvolatile semiconductor storage device is finished by a known method.

Although FIGS. 9A and 9B illustrate the case where the n-type impurity diffusion layers 115 of the memory cells are separated from each other, the present invention is not necessarily limited to this structure. For example, the n-type impurity diffusion layer 115 of the memory cells may be connected to each other, as illustrated in FIGS. 10A and 10B. In the case where the n-type impurity diffusion layers 115 are connected like this, it is determined whether electric charge is accumulated in a cell, by applying a voltage to a gate electrode thereof and intercepting a current path of the SOI crystal layer directly under the relevant gate electrode in the SOI crystal layer 105. This operation is first enabled by adopting an SOI structure, that is, by applying a sufficiently thin SOI crystal layer to memory cells as in the first embodiment.

In the first embodiment, the surface level of the non SOI region serving as the selective gate transistor portion is almost aligned with the surface level of the SOI region serving as the memory cell portion, as illustrated in FIG. 3A. However, the invention is not limited to this structure, but the surface levels of the two regions may differ from each other. For example, as illustrated in FIG. 11, the invention may have a structure in which the selective gate transistor portion is lower than the memory cell portion, without performing CMP in the state of having the amorphous silicon film.

Further, although the first embodiment describes a method of manufacturing memory cells using a floating gate electrode as an electric charge accumulating layer, the same method is applicable to memory cells such as MONOS cells, which use an insulating film such as a silicon nitride film as an electric charge accumulating layer.

According to the first embodiment as described above, the crystal portion which is formed by the first solid-phase crystallization and includes a crystal mismatch surface is amorphized, and solid-phase crystallization is performed again in a limited area. Thereby, it is possible to align the positions of portions of the crystal mismatch surface, in other words, restrict the position of the crystal mismatch surface to a narrow range. Specifically, it is possible to control occurrence of defective regions caused by solid-phase crystallization. Therefore, regions where no circuits can be provided are limited to a minimum, and reduction in the manufacturing cost can be achieved by effectively using the SOI crystal layer. Further, it is possible to prevent the crystal mismatch surface from being positioned directly under memory cells, and increase the reliability of the cells.

Second Embodiment

The second embodiment provides a method in which portions other than the central portion of the BOX oxide film, where a seam between solid-phase crystallizations from adjacent opening portions is expected to exist, are masked, ion implantation is performed by using oxygen, nitrogen or carbon, and thereafter solid-phase crystallization is performed, to solve the problems of prior art. Thereby, it is possible to control the position of the crystal grain boundary to fall within a region where ions are implanted.

A method of manufacturing memory cells according to the second embodiment will be explained below with reference to FIGS. 12A to 12C to FIGS. 22A to 22C. In FIGS. 12A to 12C to FIGS. 22A to 22C, A is a cross-sectional view taken in the channel length direction (bit line direction), B is a cross-sectional view taken in the channel width direction (word line direction), and C is a plan view. Further, A illustrates a cross section taken along line A-A' in plan view C, and B illustrates a cross section taken along line B-B' of plan view C.

Figure 12C:
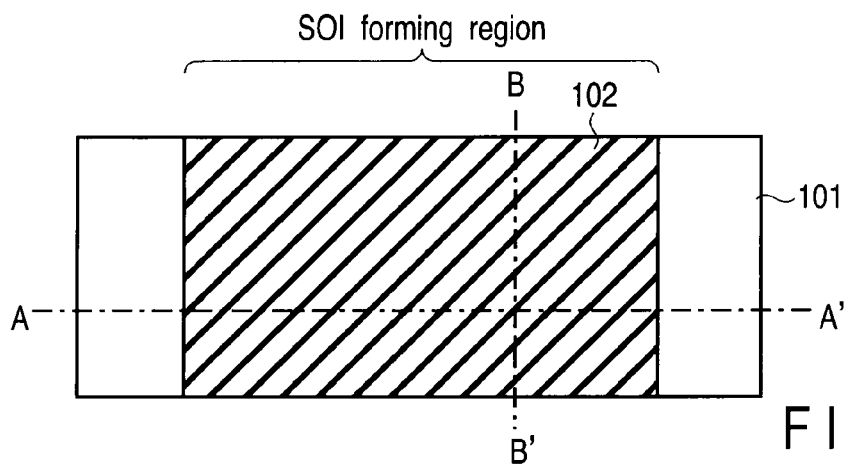
FIGS. 12A to 12C are a plan view and cross-sectional views illustrating a manufacturing step of a nonvolatile semiconductor storage device according to a second embodiment.
Figures 12A, 12B:
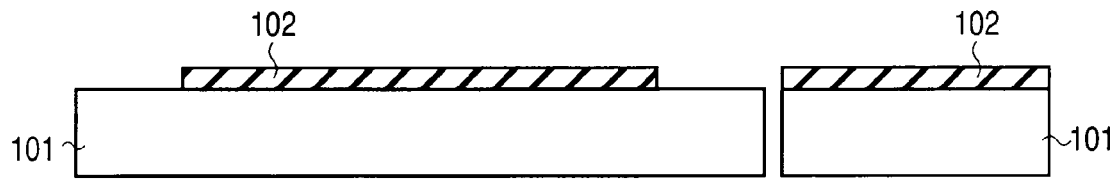

First, as illustrated in FIGS. 12A to 12C, a silicon oxide film (embedded insulating film) 102 having a thickness of 50 nm is formed on a p-type single-crystal silicon substrate 101 having a (001) surface orientation. Then, a part of the region of the silicon oxide film 102 is removed with a patterned resist (not shown) used as a mask, and part of the silicon substrate 101 is exposed. In this step, the pattern of the resist mask is set to be parallel with either of <100> orientation and <010> orientation. Thereby, stripe opening portions serving as seeds of solid-phase crystallization described below are formed.

Figure 13C:
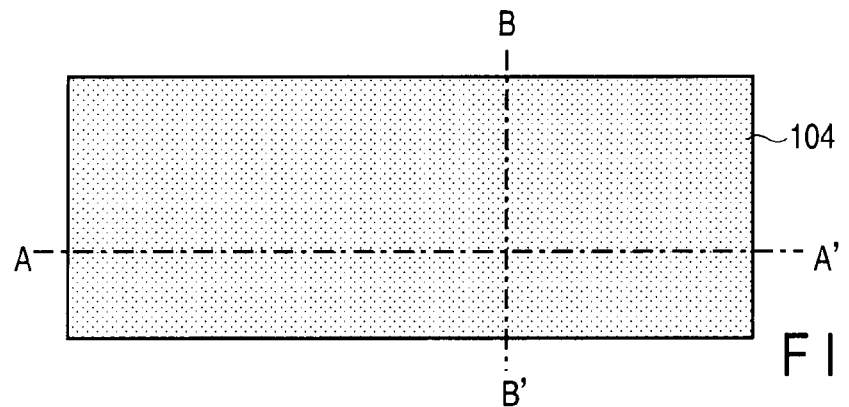
FIGS. 13A to 13C are a plan view and cross-sectional views illustrating a manufacturing step of the nonvolatile semiconductor storage device according to the second embodiment.
Figures 13A, 13B:
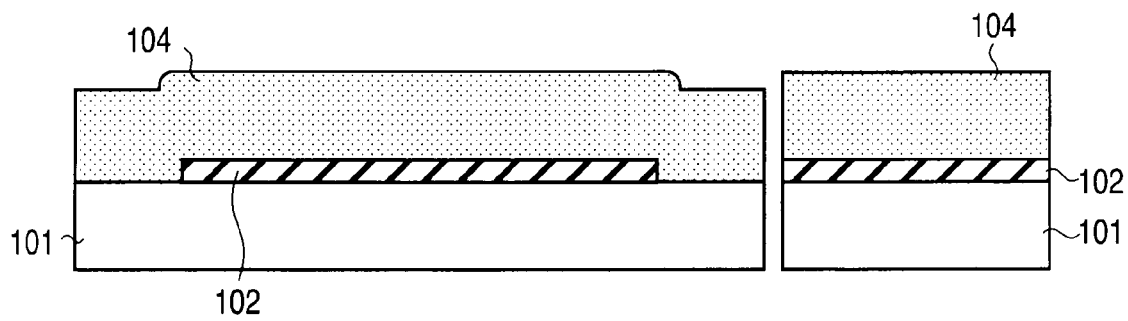

Next, as illustrated in FIGS. 13A to 13C, amorphous silicon film 104 having a thickness of 200 nm is deposited on the whole surface of the substrate 101. An LPCVD device is used for deposition of the amorphous silicon film 104, and the film formation temperature is 550° C. To suppress formation of a natural oxide film in an interface between the amorphous silicon film 104 and the substrate 101, the wafer is subjected to thermal treatment in hydrogen atmosphere at 900° C. for 1 minute in the LPCVD device before deposition of the amorphous silicon film 104.

In this step, when the thickness of the amorphous silicon film 104 is set to 200 nm, an Si film which is grown directly on the seeds is crystallized from a region contacting the substrate in film formation, and may consequently be grown with only a 50% thickness of the amorphous film 104. This is because the surface in the amorphous state has a higher dangling bond density exposed to the surface than in the case where the surface is in the crystallized state, and has a higher atomic deposition probability. In the same manner as the first embodiment, the surface may be formed flat by deposition of two amorphous silicon films.

Figure 14C:
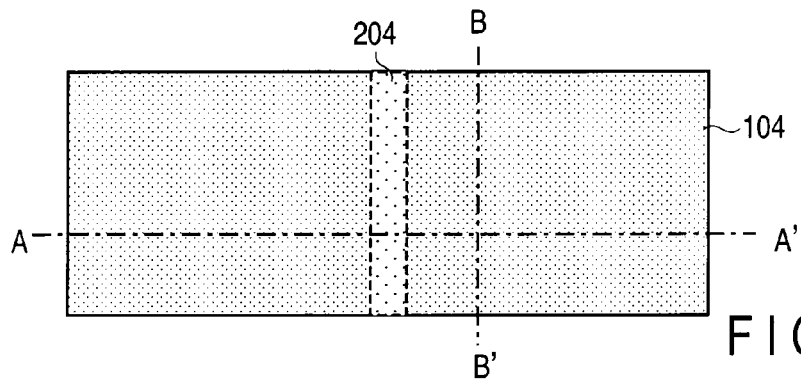
FIGS. 14A to 14C are a plan view and cross-sectional views illustrating a manufacturing step of the nonvolatile semiconductor storage device according to the second embodiment.
Figure 14A:
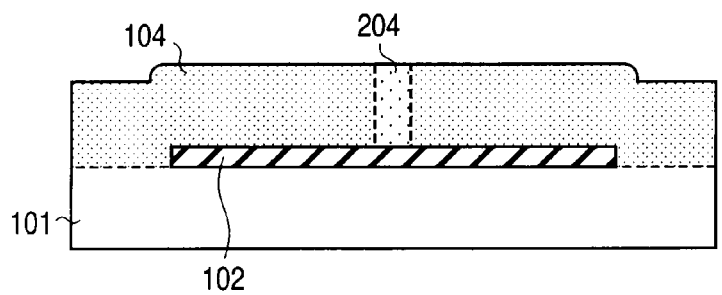
Figure 14B:
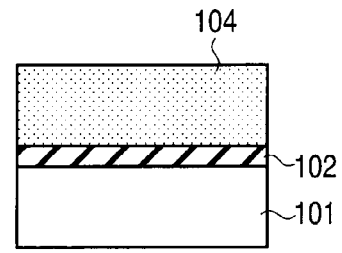

Next, a resist (not shown) is formed on the wafer, and thereafter the resist is provided with an opening in the vicinity of the midpoint between the left and the right opening portions of the silicon oxide film 102. Then, oxygen ions are implanted under the condition of a dose amount of $3 \times 10^{15}$ $cm-2$ and an acceleration energy of −40 keV, with the resist used as a mask. Thereby, as illustrated in FIGS. 14A to 14C, obtained is a structure in which an amorphous silicon layer 204 having a high concentration of oxygen exists in a part of the amorphous silicon film 104 on the silicon oxide film 102. The width of the opening of the resist is 35 nm.

Figure 15C:
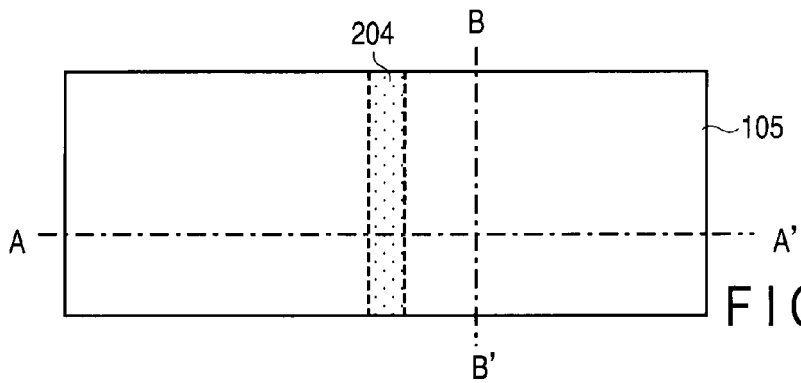
FIGS. 15A to 15C are a plan view and cross-sectional views illustrating a manufacturing step of the nonvolatile semiconductor storage device according to the second embodiment.
Figure 15A:
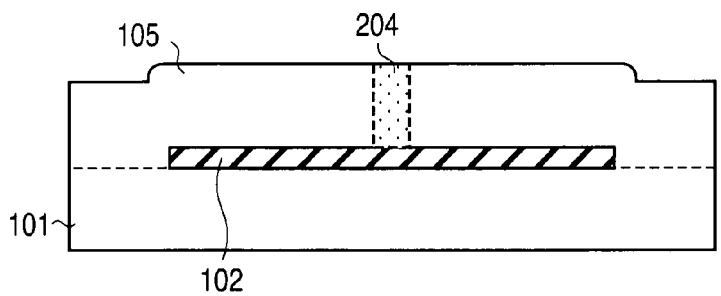
Figure 15B:
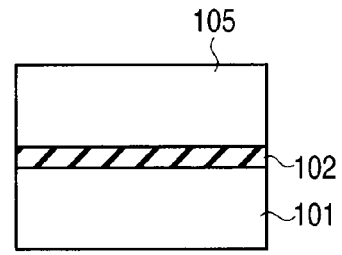

Next, the wafer having the above structure is subjected to heat treatment in a nitrogen atmosphere at 650° C. for 30 minutes, and thereby monocrystallization is performed by solid-phase crystallization, with the silicon substrate 101 contacting the amorphous silicon layer 104 used as a seed. In this step, the advance speed of monocrystallization in the lateral direction from the seed is 2.1 μm/hour. When the crystallized state of SOI crystal layer 105 is observed after the solid-phase crystallization, the region 104 into which no oxygen ions are implanted is monocrystallized by solid-phase crystallization, while the region 204 containing a high concentration of oxygen remains amorphous, as illustrated in FIGS. 15A to 15C.

Figure 16C:
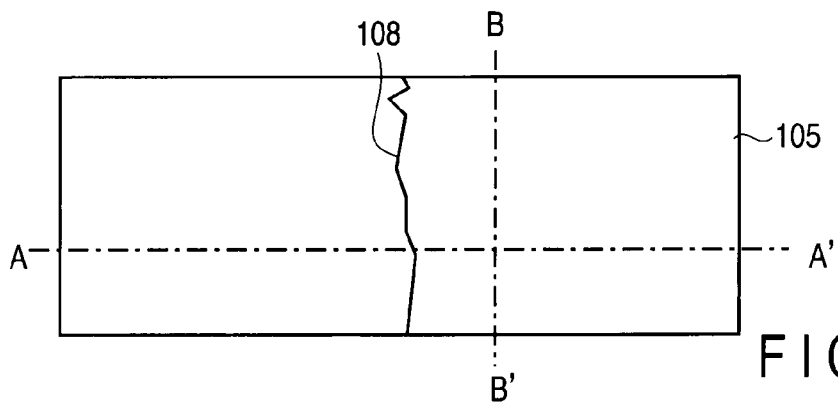
FIGS. 16A to 16C are a plan view and cross-sectional views illustrating a manufacturing step of the nonvolatile semiconductor storage device according to the second embodiment.
Figures 16A, 16B:
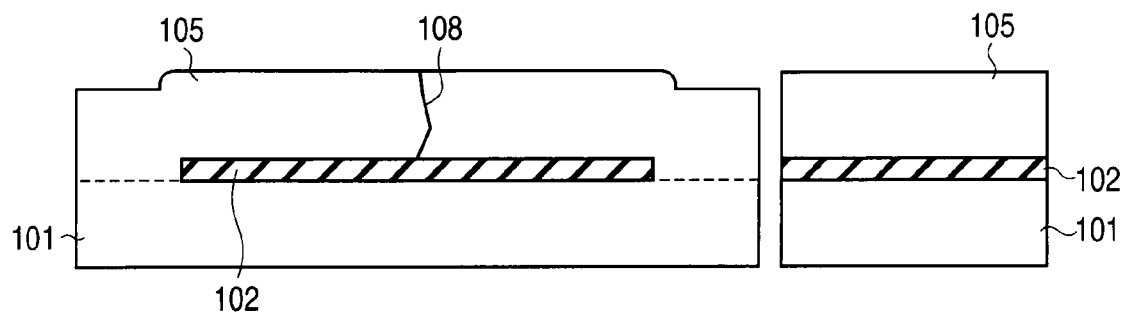

Thereafter, when the wafer is subjected to heat treatment in a nitrogen atmosphere at 950° C. for 30 minutes, the region 204 which was not crystallized by heat treatment at 650° C. is also crystallized, as illustrated in FIGS. 16A to 16C. The crystal layer of the region 204 is indistinguishable from the SOI crystal layer 105 crystallized earlier, by observation. As a result, solid-phase crystallizations advance from two seed regions, and a crystal mismatch surface 108 formed as an encounter surface can be positioned in the region where oxygen ions have been implanted with a high concentration, that is, in a limited area having a width of 45 nm.

Figure 17C:
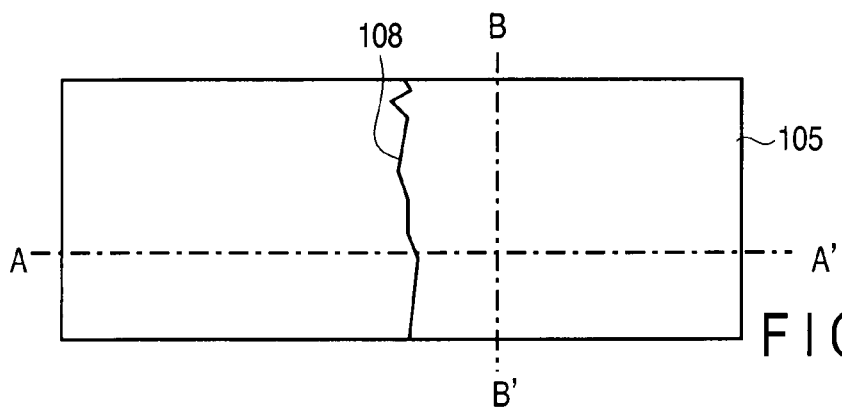
FIGS. 17A to 17C are a plan view and cross-sectional views illustrating a manufacturing step of the nonvolatile semiconductor storage device according to the second embodiment.
Figures 17A, 17B:
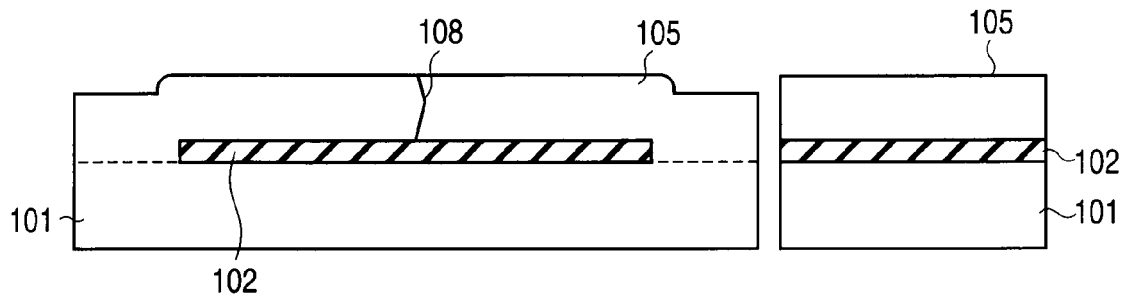
Figure 18C:
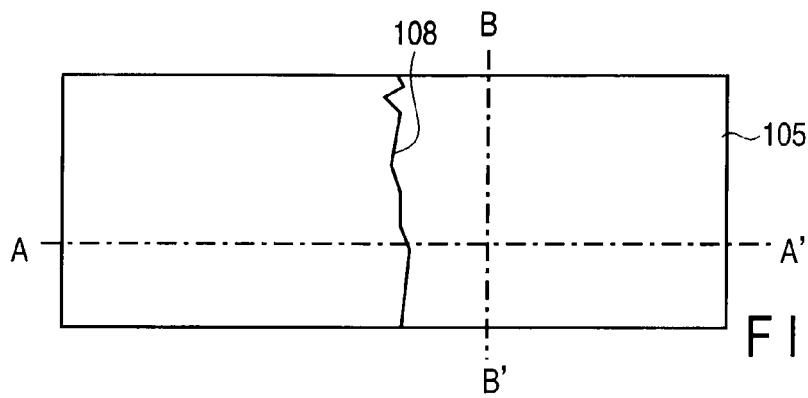
FIGS. 18A to 18C are a plan view and cross-sectional views illustrating a manufacturing step of the nonvolatile semiconductor storage device according to the second embodiment.
Figures 18A, 18B:
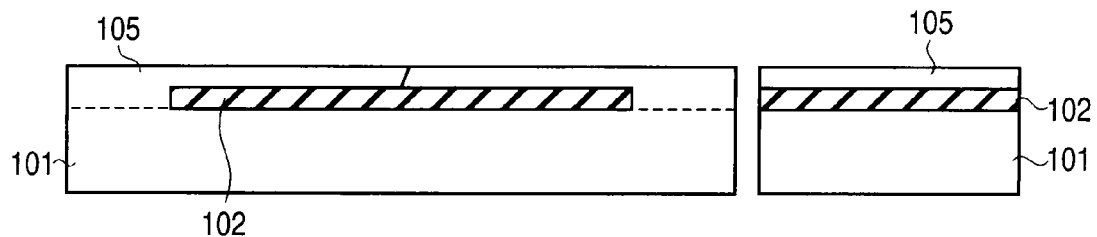

Next, as illustrated in FIGS. 17A and 17B, the SOI crystal layer 105 is thinned by thermal oxidation. Then, as illustrated in FIGS. 18A to 18C, the surface of the wafer is polished by CMP and flattened. As a result, the thickness of the film on the SOI region is reduced to 30 nm, which is a proper thickness for forming and operating a memory cell array on the SOI crystal layer. Thereafter, an oxide film layer formed by thermal oxidation is removed by etching using hydrofluoric acid diluted with water.

Figure 19C:
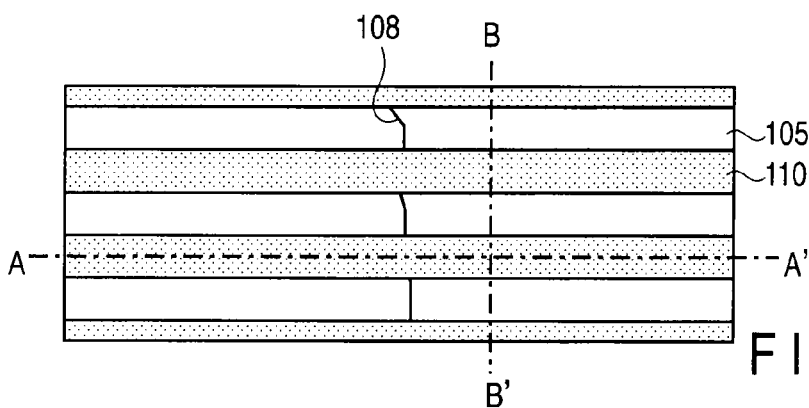
FIGS. 19A to 19C are a plan view and cross-sectional views illustrating a manufacturing step of the nonvolatile semiconductor storage device according to the second embodiment.
Figures 19A, 19B:
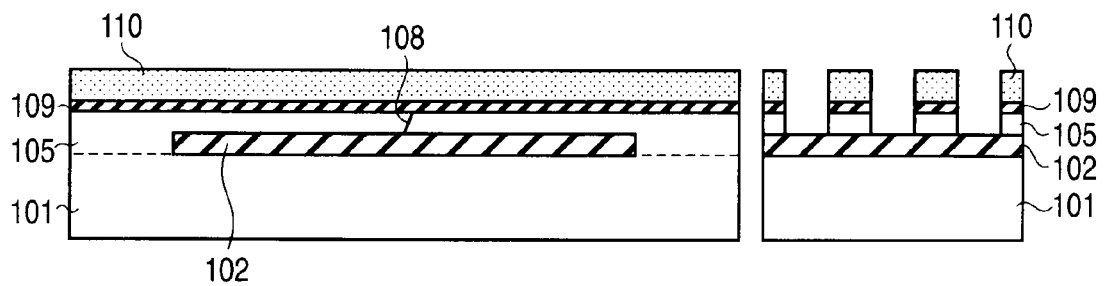

Next, as illustrated in FIGS. 19A to 19C, a gate insulating film (tunnel insulating film) 109 having a thickness of about 7 nm is formed on the whole surface by thermal oxidation or the like, and then a phosphorus-doped polycrystalline silicon layer 110 serving as a floating gate electrode and having a thickness of about 50 nm is deposited by CVD or the like. Then, parts of the polycrystalline silicon layer 110, the gate insulating film 109, and the SOI crystal layer 105 are removed by RIE or the like, with a striped resist (not shown) used as a mask, and thereby device isolation trenches are formed.

Figure 20C:
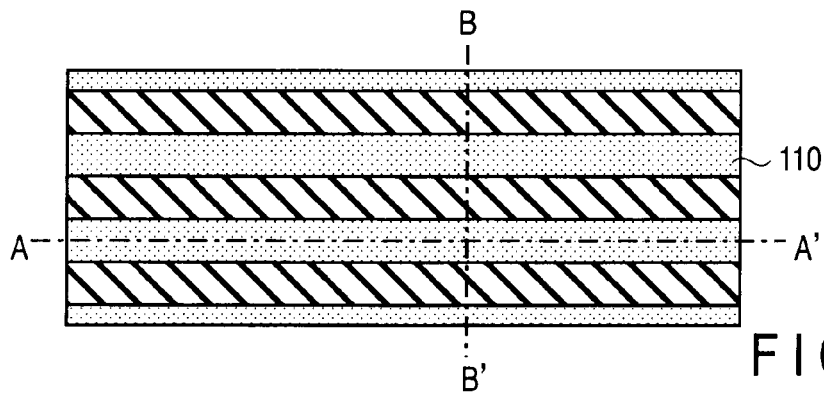
FIGS. 20A to 20C are a plan view and cross-sectional views illustrating a manufacturing step of the nonvolatile semiconductor storage device according to the second embodiment.
Figure 20A:
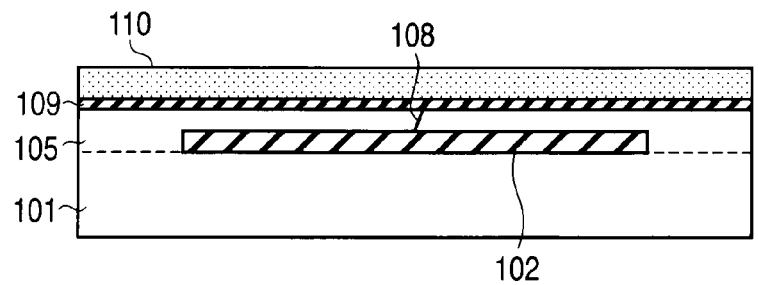
Figure 20B:
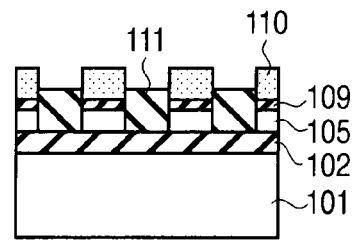

Next, as illustrated in FIGS. 20A to 20C, an embedded insulating film 111 is embedded into the device isolation trench regions by application or the like. Formation of imperfect embedded regions which are called voids can be avoided, by applying an application insulating film such as polysilazane. The dielectric constant of the embedded insulating film 111 is preferably low, to improve the dielectric strength voltage between adjacent memory cells. Therefore, it is desirable that vapor oxidation is performed after applying the application insulating film, to desorb impurities such as nitrogen, carbon and hydrogen in the film and convert the film into the silicon oxide film. Further, thermal oxidation or radical oxidation may be performed before or after the application insulating film 11 is embedded, to repair crystal defects which are generated in trench surface portions when the device isolation trenches are formed. Further, a composite film of a CVD insulating film and an application insulating film may be embedded, to improve the insulating property of the embedded insulating film 111.

Figure 21C:
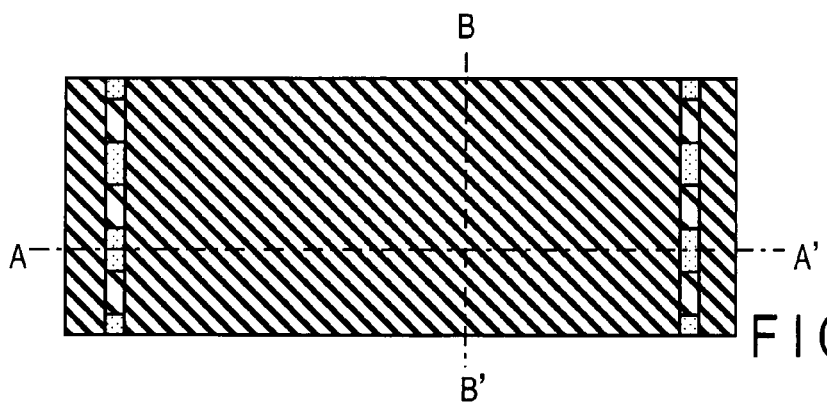
FIGS. 21A to 21C are a plan view and cross-sectional views illustrating a manufacturing step of the nonvolatile semiconductor storage device according to the second embodiment.
Figure 21A:
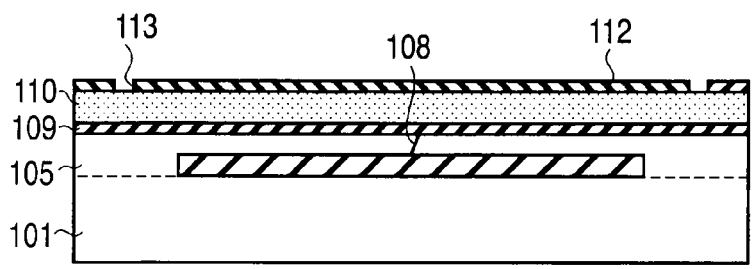
Figure 21B:
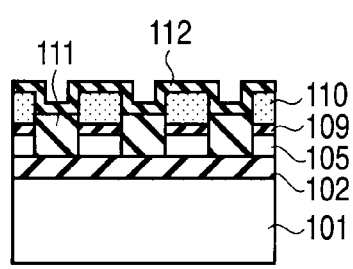

Next, as illustrated in FIGS. 21A to 21C, an ONO film 112 serving as an interelectrode insulating film and having a thickness of about 15 nm is formed on the whole surface by ALD or the like. Then, slit portions 113 having a width of about 50 nm are formed by RIE or the like in regions where selective gate transistors are to be formed, with a patterned resist (not shown) used as a mask. Thereby, parts of the polycrystalline silicon layer 110 are exposed.

Figure 22C:
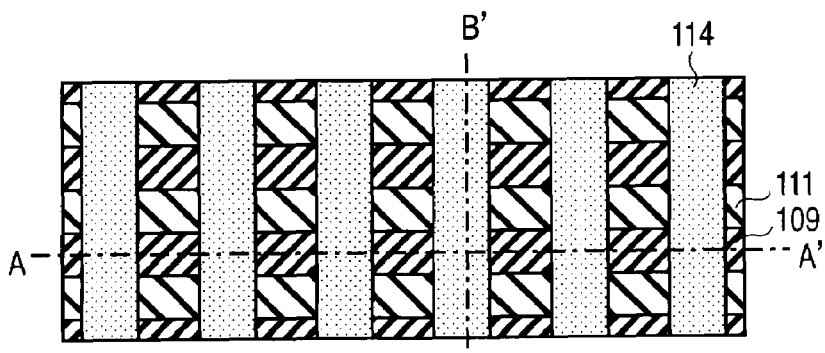
FIGS. 22A to 22C are a plan view and cross-sectional views illustrating a manufacturing step of the nonvolatile semiconductor storage device according to the second embodiment.
Figure 22A:
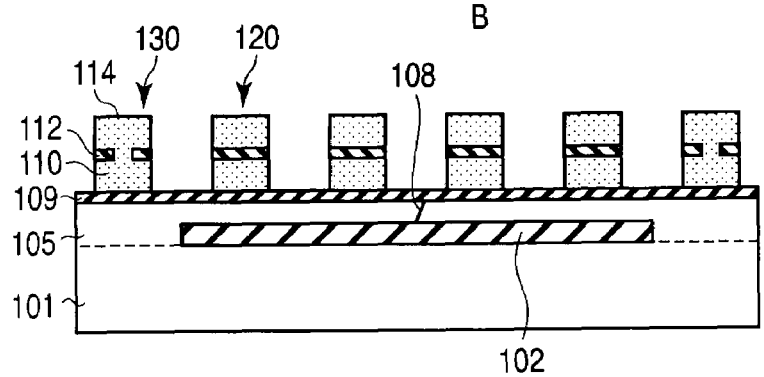
Figure 22B:
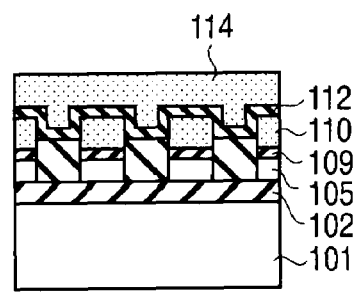

Next, as illustrated in FIGS. 22A to 22C, a tungsten silicide layer 114 serving as a control gate electrode is formed on the whole surface by spattering or the like. In this step, the polycrystalline silicon layer 110 is electrically connected to the tungsten silicide layer 114 in the slit portions 113. Then, parts of the tungsten silicide layer 114, the ONO film 112, and the polycrystalline silicon layer 110 are selectively etched by RIE or the like, with a striped resist (not shown) used as a mask. Thereby, two-layer gate structures 120 of memory cells and stacked gate electrode structures 130 of selective gate transistors 130 are formed.

As is clear from FIGS. 22A to 22C, the region into which oxygen ions are implanted is laid out such that the region does not overlap the channel portions of cell transistors, and thus the crystal mismatch surface is prevented from overlapping the channel portions of the cell transistors. Thereby, it is possible to suppress undesirable deterioration in the properties of the cell transistors.

If such oxygen ion implantation is not performed, the crystal mismatch surface is not always formed in the midpoint of the seed portions, and consequently a NAND string having the crystal mismatch surface 108 is formed with a certain probability in a position shifted from the midpoint of the seed portions. This causes variations in the properties of flash memories.

Further, since a region containing a high concentration of oxygen is formed in a position other than a region directly under the channels of the cell transistors as described above, the diffusion coefficient of dopant elements in the region is reduced. To realize the structure described in the first embodiment, the width of the ion implanted region have to be set larger than the width of other regions between cell transistors, and consequently dopant for forming a diffusion layer is implanted with high concentration. However, reduction in diffusion coefficient by existence of oxygen is useful for reducing fluctuations in device operation due to local existence of such a wide diffusion layer.

Although the first embodiment describes that the oxygen ion implantation in the step illustrated in FIGS. 14A to 14C is performed under the conditions that the dose amount is $3 \times 10^{15}$ cm$^{-2}$ and the acceleration energy is 40 keV, the invention is not limited to the conditions. Crystallization of the implanted region is suppressed with the above implantation conditions, because the peak concentration of oxygen of the implanted region becomes about $1 \times 10^{20}$ cm$^{-3}$, which delays the solid-phase crystallization speed in the implanted region, and with which the implanted region can be monocrystallized after thermal treatment at high temperature. Since such a situation can be achieved with the oxygen concentration from $1 \times 10^{19}$ cm$^{-3}$ to $1 \times 10^{21}$ cm$^{-3}$, it suffices that a certain limited region has such an oxygen concentration. Specifically, the peak value in ion implantation may be small or large.

In addition, the implanted element may be elements other than oxygen, such as nitrogen, argon, and carbon, or a combination thereof, as long as the element reduces the solid-phase crystallization speed.

According to the second embodiment as described above, oxygen, nitrogen, or carbon ions are implanted in the vicinity of the center of the BOX oxide film, where a seam of solid-phase crystallizations from adjacent opening portions will occur, before the amorphous silicon film 104 on the silicon oxide film 102 is monocrystallized by solid-phase crystallization. Thereby, the position of the crystal mismatch surface 108 can be controlled in the ion-implanted region 204. Therefore, it is possible to align the positions of portions of the crystal mismatch surface, in other words, restrict the position of the crystal mismatch surface to a narrow range, and the same effect as the first embodiment is obtained.

Third Embodiment

Although the method of the second embodiment limits the oxygen implanted region by a resist mask, the method cannot set a width of the region which limits the crystal mismatch surface to be smaller than the width which can be opened by lithography. To solve this problem, in the third embodiment, the width of the opening portions is narrowed by sidewall transfer, and thereby the position where a crystal mismatch surface is formed can be controlled to fall within a region narrower than the minimum processing width of lithography.

Figure 23A:
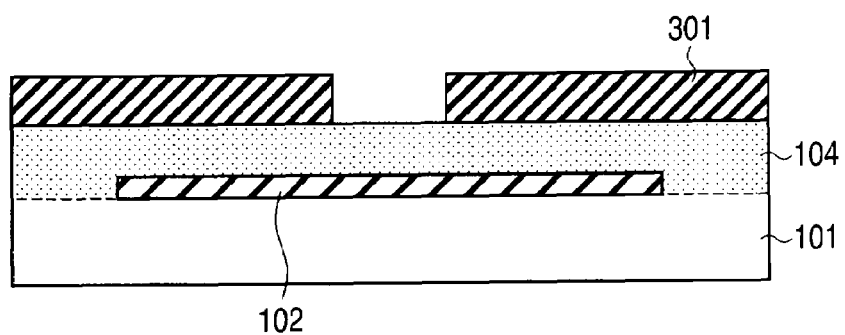
FIGS. 23A and 23B are cross-sectional views illustrating manufacturing steps of a nonvolatile semiconductor storage device according to a third embodiment.

In the third embodiment, as illustrated in FIG. 23A, a silicon oxide film 301 having a thickness of 200 nm is deposited as a mask material on an amorphous silicon film 104, and then the silicon oxide film 301 is patterned. Thereby, a structure having an opening portion having a width of 30 nm is formed. If ion implantation is performed in this state, the same structure as in the second embodiment is achieved.

Figure 23B:
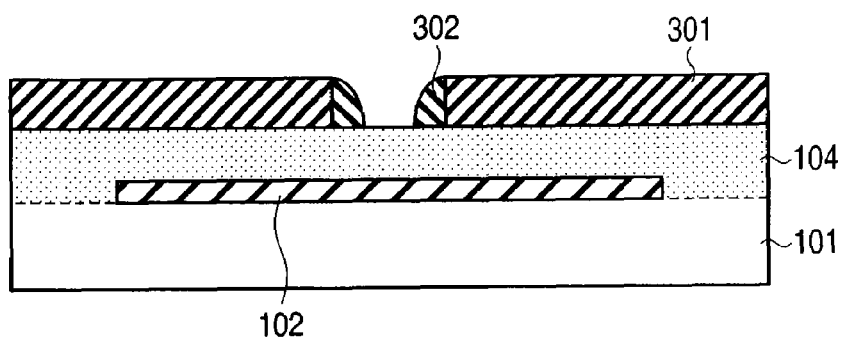

Next, as illustrated in FIG. 23B, sidewall films 302 are formed on side surfaces of the opening of the silicon oxide film 301, by a publicly known sidewall-leaving method using film deposition and etchback.

Specifically, after a silicon nitride film 302 is deposited on the whole surface by CVD or the like, the silicon nitride film 302 is etched by RIE or the like until the surface of the silicon oxide film 301 is exposed, and thereby the silicon nitride film 302 is left only on the side walls of the opening of the silicon oxide film 301. Thereby, the width of the opening portion can be narrowed to 10 nm. The following steps are the same as those of the second embodiment.

As described above, according to third embodiment, the width of the opening portions in the ion implantation mask material can be narrowed beyond the limit of lithography, and thereby the width of fluctuations of the crystal mismatch surface formed after solid-phase crystallization can be limited to a range within 10 nm. Therefore, demerits in terms of area can be further reduced. Specifically, the position where the crystal mismatch surface is formed can be controlled to fall within a region narrower than the minimum processing width which can be made using a mask. Therefore, the SOI crystal layer can be further effectively used, and the manufacturing cost can be further reduced.

Fourth Embodiment

FIGS. 24A to 24D are cross-sectional views illustrating manufacturing steps of a nonvolatile semiconductor storage device according to a fourth embodiment of the present invention.

First, as illustrated in FIG. 24A, to form a partial SOI on the silicon substrate, a thermal oxide film (silicon oxide film) 102 serving as BOX is formed with a thickness of about 50 nm on a single-crystal silicon substrate 101. Opening portions are provided at predetermined intervals in the oxide film 102, and the surface of the silicon substrate under the BOX is exposed.

Next, as illustrated in FIG. 24B, an amorphous silicon film 104 having a thickness of, for example, 200 nm is deposited by CVD or the like. Deposition of the amorphous silicon film 104 is performed by using an LPCVD device at 550° C. Then, the amorphous silicon film 104 is etched by normal lithography and RIE, and thereby trenches are formed. Specifically, slit-like trenches 104a are formed in the vicinity of midpoint between adjacent opening portions of the oxide film 102, and the BOX film is exposed. The trenches 104a formed in the amorphous silicon film 104 divide the amorphous silicon film 104 on the oxide film 102. Further, each divided pattern of the amorphous silicon film 104 has only one opening portion.

Next, as illustrated in FIG. 24C, annealing is performed at 600° C. for about 2 hours, and thereby the amorphous silicon film 104 is monocrystallized by solid-phase crystallization. Each of the divided regions of the amorphous silicon film 104 is changed to a silicon single-crystal layer (SOI crystal layer) 105. Since each region has only one opening portion (seed portion), crystals grown from different crystal seeds do not encounter with each other, and no crystal mismatch surfaces caused by encounter are generated. Thereby, it is possible to provide SOI crystal layers having few crystal defects in desired positions in the semiconductor substrate.

Thereafter, the SOI crystal layers 105 are thinned by CMP or the like, and then stacked gate structures 120 of memory cells and selective gate stacked structures 130 are formed on the SOI crystal layers 105 in the same manner as in the first to third embodiments, as illustrated in FIG. 24D. Thereby, a memory cell array is formed.

FIG. 25 is an enlarged view of a part of the structure illustrated in FIG. 24D. In FIG. 25, reference numeral 109 denotes a gate insulating film (tunnel insulating film), 110 denotes a phosphorus-doped polycrystalline silicon layer serving as a floating gate electrode, 112 denotes an ONO film serving as an interelectrode insulating film, 114 denotes a tungsten silicide layer serving as a control gate electrode, 120 denotes a two-layer gate structure of memory cells, and 130 denotes a stacked layer gate electrode structure of selective gate transistors. Memory cells are formed on the SOI region, and one of the selective gate transistors is formed in a position other than the SOI region.

When the invention is used for a circuit of a NAND flash memory, the opening portions serving as seeds of solid-phase crystallization for providing a partial SOI layer do not become SOI, but only a bulk Si substrate. Cells formed on SOI may be greatly different in the transistor properties from cells formed on bulk Si. Therefore, in the fourth embodiment, at least one selective gate transistor of a NAND cell is formed in a seed portion, to prevent a difference in transistor properties between memory cell portions and effectively use the substrate area. Further, the other selective gate transistor is formed at an end of the SOI, that is, in a region adjacent to a slip, where many crystal defects may exist since it is most distant from the seed portion of the substrate. Thereby, it is possible to effectively use an SOI layer in the best condition for NAND memory cell portions.

Although FIGS. 24D and 25 illustrate four memory cells as a NAND cell unit, the invention is not limited to this structure, but the number of memory cells in one NAND cell unit may be any number. Generally, the number of memory cells in one NAND cell unit is 16 or 32.

As described above, according to the fourth embodiment, trenches which divide the amorphous silicon film into a region on one opening portion side and a portion on the other opening portion side are provided in the vicinity of the midpoint between adjacent opening portions, before the amorphous silicon film 104 on the silicon oxide film 102 is subjected to solid-phase crystallization. Thereby, it is possible to prevent occurrence of crystal mismatch surfaces caused by contact of growing ends of solid-phase crystallizations starting from adjacent opening portions. Therefore, it is possible to arrange memory cell arrays with defects well controlled, without wasting the surface area of the SOI crystal layer.

Fifth Embodiment

In the fifth embodiment, explained is a method of solving restrictions on design when partial SOIs are formed on a substrate by solid-phase crystallization. Restrictions on design include the case where the distance of lateral growth on the BOX by solid-phase crystallization is shorter than a required distance of a partial SOI. Further, restrictions on design include the case where the intervals between opening portions, which are provided in the BOX and serve as seeds of solid-phase crystallization, have to be set longer than the distance with which safe growth of solid-phase crystallization can be expected, that is, the distance with which clean growth can be expected with crystal defects suppressed.

Although the fifth embodiment is the same as the fourth embodiment until the step where BOX is provided and opening portions serving as seeds of partial SOIs, the fifth embodiment has wider intervals between opening portions than the fourth embodiment. If only small slits are provided in the midpoint between opening portions as in the fourth embodiment, crystal defects are generated before growth ends of solid-phase crystallizations meet at the midpoint in annealing for solid-phase crystallization. To prevent it, an amorphous deposition film is formed in advance with a sufficient length for solid-phase crystallization, as illustrated in FIG. 26A.

Specifically, a silicon oxide film (embedded insulating film) 102 having a thickness of 50 nm is formed on a surface of a single-crystal silicon substrate 101, and then part of the silicon oxide film 102 is removed to expose part of the silicon substrate 101. Then, a first amorphous silicon film 404 is formed by CVD or the like, and then the amorphous silicon film 404 is removed, except for the film on and near the opening portions of the silicon oxide film 102.

Next, as illustrated in FIG. 26B, the amorphous silicon film 404 is annealed and subjected to solid-phase crystallization, and thereby silicon single-crystal layers (first SOI crystal layer) 405 are formed. In the fifth embodiment, these island-like SOI crystal layers are used as seeds of next solid-phase crystallization.

Next, as illustrated in FIG. 26C, a second amorphous silicon film 504 is deposited, and then trenches (slits) 504a are provided in the same manner as the third embodiment. Thereafter, in the same manner as the third embodiment, the amorphous silicon film 504 is annealed to form single crystal by solid-phase crystallization, and thereby silicon single-crystal layers (second SOI crystal layers) are formed.

As described above, restrictions to solid-phase crystallization can be eliminated and flexibility of device design can be increased, by repeating formation, processing and solid-phase crystallization of an amorphous silicon film. Further, it is possible to grow an SOI crystal layer in minute portions where opening portions of BOX serving as seeds of solid-phase crystallization cannot be provided.

Further, when crystals of germanium or silicon germanium are formed on a silicon substrate, there is the problem that intervals between lattices are different between the silicon crystal and the germanium (or silicon germanium) crystal. Therefore, silicon germanium having composition (for example, having Ge concentration of 5% or less) relatively close to that of silicon is formed as the first SOI layer of the fifth embodiment. Thereafter, silicon germanium having Ge concentration of 10% is formed as the second SOI layer. The concentration of Ge is gradually changed like this. Thereby, distortion provided to the boundary due to difference between lattices can be suppressed to a minimum. Further, the SiGe films are formed separately, and thereby concentration control can be easily performed, and it is possible to form MOSFET channel regions of Ge or SiGe.

As described above, according to the fifth embodiment, the same effect as the fourth embodiment can be obtained as a matter of course, and SOI regions can be broadened or arranged with flexibility, without constraints by the limit of epitaxial growth of solid-phase crystallization. Further, when SOI is to be formed with a film such as SiGe and Ge, which has a different lattice constant from Si, the SiGe compositions of the first and the second SOIs are gradually changed from Si to Ge. Thereby, it is possible to form a partial SOI having different crystal composition, without crystal defects caused by difference in lattice constant.

Sixth Embodiment

The sixth embodiment describes an example of the processing design of the amorphous silicon film.

Figure 27A:
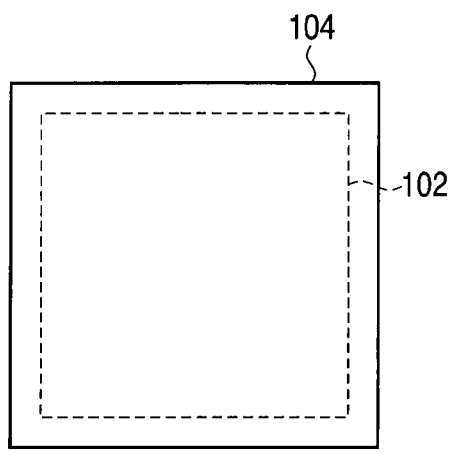
FIGS. 27A and 27B are plan views for explaining a sixth embodiment, illustrating a state of a crystalline defect of an SOI after SPE in a structure where a BOX film is surrounded by an opening portion.
Figure 27B:
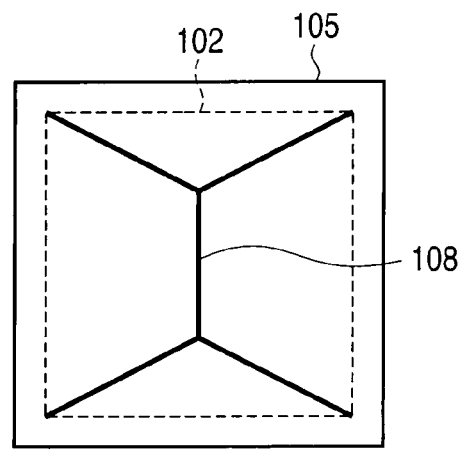

As illustrated in FIG. 27A, in the structure where the silicon oxide film (BOX film) 102 being a base is surrounded by opening portions serving as seeds of crystallization, solid-phase crystallization advances with each of left and right, and upper and lower sides used as seeds. Therefore, the SOI crystal layer 105 after solid-phase crystallization has crystal defects (crystal mismatch surface) 108 as illustrated in FIG. 27B.

Figure 28A:
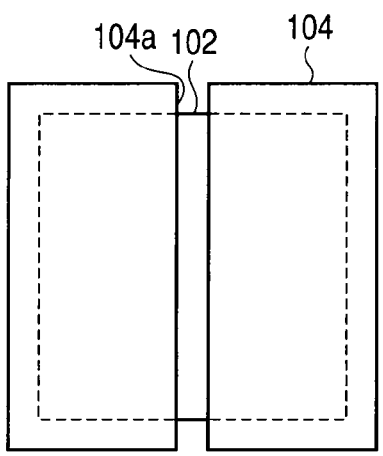
FIGS. 28A and 28B are plan views for explaining the sixth embodiment, illustrating a state of a crystalline defect of the SOI after SPE in a structure where slits are added to the BOX film surrounded by the opening portion.
Figure 28B:
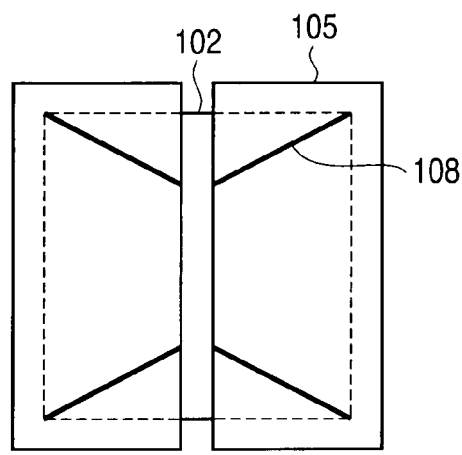

In comparison with this, as illustrated in FIG. 28A, after a slit 104a is formed in the amorphous silicon film 104, the amorphous silicon film 104 is subjected to solid-phase crystallization. In this case, as illustrated in FIG. 28B, no crystal defect is caused by crystal mismatch in the center seam of the SOI crystal layer 105, by virtue of the slit disposed in the midpoint between the left and right openings. However, crystal defects 108 still occur in positions where solid-phase crystallization starting from the top or the bottom meets solid-phase crystallization starting from the right and the left.

Figure 29A:
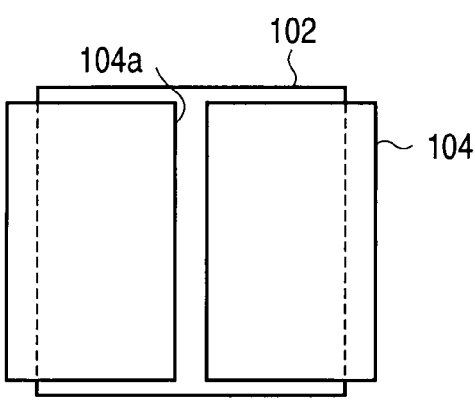
FIGS. 29A and 29B are plan views for explaining the sixth embodiment, illustrating a state of a crystalline defect of the SOI after SPE, in a structure where slits are added to the BOX film surrounded by an opening portion and amorphous silicon does not contact upper and lower openings.
Figure 29B:
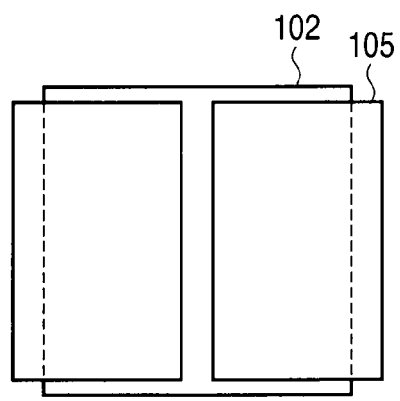

To avoid this, as illustrated in FIG. 29A, the amorphous silicon film is processed to prevent solid-phase crystallization starting from the upper side and the bottom side. Specifically, the amorphous silicon film 104 is processed to contact opening portions of the BOX film 102 on the right and the left sides, while it does not contact opening portions of the BOX film 102 on the upper and the bottom sides. Thereby, as illustrated in FIG. 29B, solid-phase crystallization extends only from the right and the left sides, and no crystal defects 108 illustrated in FIG. 28B occur. Specifically, it is possible to form the SOI crystal layer 105 having a good quality, without crystal defects 108.

MODIFICATIONS

The present invention is not limited to the above embodiments. In the above embodiments, all the regions to be monocrystallized by solid-phase crystallization are deposited as amorphous silicon, and subjected to solid-phase crystallization in heat treatment performed thereafter. However, the present invention is not limited to this structure, but may have the following structures (1 and 2).

(1) After a silicon film is deposited in an amorphous state, and heat treatment is performed with a thermal history larger than the temperature and the time by which amorphous is crystallized. Then, the silicon film is amorphized again by silicon or germanium ion implantation, and subjected to heat treatment for solid-phase crystallization. Thereby, it is possible to increase the density of amorphous silicon in solid-phase crystallization. Therefore, no volume contraction occurs in solid-phase crystallization, and the solid-phase crystallization speed increases. Therefore, it is possible to increase the distance and the area which can be monocrystallized by solid-phase crystallization.

(2) After a region to be monocrystallized by solid-phase crystallization is deposited in a polycrystalline state, the region is amorphized again by silicon or germanium ion implantation, and then subjected to heat treatment for solid-phase crystallization. By adopting this step, it is possible to obtain amorphous silicon having a density higher than that in the case where silicon is deposited in an amorphous state. Therefore, no volume contraction occurs in solid-phase crystallization, and fast solid-phase crystallization speed can be obtained. Thus, it is possible to increase the solid-phase crystallization distance, and form a thin-film SOI crystal layer having a large area.

In addition, although the embodiments show an example in which nonvolatile memory cells having a two-layer gate structure are used as memory cells, the invention is not limited to the cell structure of this type, but various nonvolatile memory cells can be used. Further, the present invention is not limited to nonvolatile storage devices, but is applicable to DRAMs and other various semiconductor storage devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor storage device, comprising:
providing an opening portion in a plurality of positions in an insulating film formed on a silicon substrate;
forming an amorphous silicon film on the insulating film, in which the opening portions are formed, and in the opening portions;
annealing and subjecting the amorphous silicon film to solid-phase crystallization with the opening portions used as seeds, and thereby monocrystallizing the amorphous silicon film;
performing ion implantation into a region including a seam portion generated by contact of growing ends from adjacent opening portions with the solid-phase crystallization, and amorphizing the region;
annealing again and subjecting the amorphized region to solid-phase crystallization, and thereby monocrystallizing the amorphized region; and
forming a memory cell array on a silicon single-crystal layer formed by the solid-phase crystallization and the second solid-phase crystallization.

2. A method according to claim 1, wherein
an element used for the ion implantation is silicon, germanium, phosphorus, arsenic, antimony, or argon.

3. A method according to claim 1, wherein
to form the amorphous silicon film, a first amorphous silicon film is embedded into the opening portions of the insulating film, and thereafter a second amorphous silicon film is formed on the insulating film and the first amorphous silicon film.

4. A method according to claim 1, wherein
each of the opening portions of the insulating film is formed to have a stripe shape, and the opening portions are provided at predetermined intervals in a direction perpendicular to the stripe direction.

5. A method according to claim 1, wherein
the memory cell array has a NAND cell unit formed by connecting a plurality of nonvolatile memory cells in series, and selective transistors connected to both sides of the NAND cell unit, the memory cells are formed on the silicon single-crystal layer on the insulating film, and the selective transistors are formed on the silicon single-crystal layer on the opening portions.

6. A method according to claim 1, wherein
the amorphizing by the ion implantation and the following second solid-phase crystallization by annealing are performed a plurality of times.

7. A method according to claim 6, wherein
the region into which ions are implanted is gradually narrowed in the ion implantation and the solid-phase crystallization performed a plurality of times.

* * * * *